United States Patent [19]

Freeouf et al.

[11] 4,436,768
[45] Mar. 13, 1984

[54] REFRACTORY STRUCTURE AND PROCESS FOR THE PREPARATION THEREOF

[75] Inventors: John L. Freeouf, Peekskill; William J. Haag, Poughkeepsie; Jerry M. Woodall, Bedford Hills, all of N.Y.

[73] Assignee: International Business Machines Corporation, Armonk, N.Y.

[21] Appl. No.: 411,218

[22] Filed: Aug. 25, 1982

Related U.S. Application Data

[63] Continuation of Ser. No. 148,610, May 12, 1980, abandoned.

[51] Int. Cl.³ .......................... B05D 3/02; B05D 5/00
[52] U.S. Cl. .................................. 427/227; 427/294; 427/399
[58] Field of Search ...................... 427/294, 53.1, 399, 427/227

[56] References Cited

FOREIGN PATENT DOCUMENTS 466183 6/1950 Canada .
2348405 4/1975 Fed. Rep. of Germany .

OTHER PUBLICATIONS

Dreger; Lloyd et al., *Sublimation & Decomposition Studies on Boron Nitride & Aluminum Nitride*, J. Phys. Chem. 66, No. 8, pp. 1556–1559 (1962).

*Primary Examiner*—Michael R. Lusignan
*Attorney, Agent, or Firm*—Pollock, Vande Sande & Priddy

[57] ABSTRACT

A refractory compound structure comprising a substrate of a compound which is a combination of a refractory and/or metallic element and a nonmetallic element and an elemental layer of the refractory and/or metallic element on the substrate is formed by heating the refractory compound in a vacuum at a decomposition temperature for the refractory compound.

21 Claims, 1 Drawing Figure

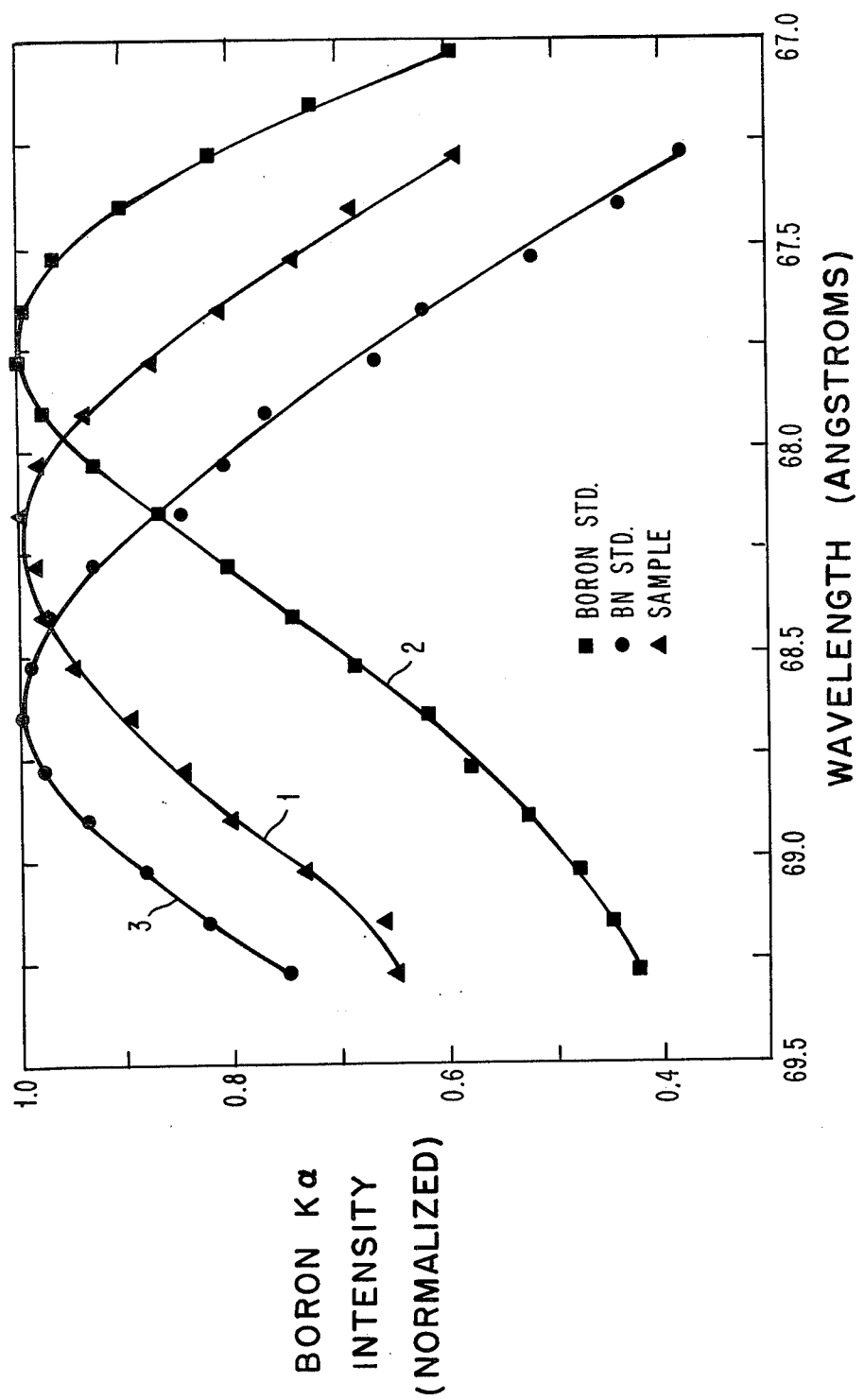

REFRACTORY STRUCTURE AND PROCESS FOR THE PREPARATION THEREOF

This is a continuation of application Ser. No. 148,610, filed May 12, 1980 now abandoned.

DESCRIPTION

1. Technical Field

The present invention is concerned with a refractory compound structure which comprises a substrate of a compound which is a combination of a refractory and/or metallic element and a nonmetallic element, and a layer of the refractory and/or metallic element on the substrate. The present invention is also concerned with the process for formation of the refractory compound structures. The present invention is especially concerned with the selective formation of the desired layer on predetermined portions of the substrate.

An especially preferred refractory structure obtained by the present invention is a refractory utensil of boron nitride having a surface region of elemental boron thereon. Such refractory utensils are suitable as source boats or crucibles for use under high vacuum conditions, such as in molecular beam epitaxy processing.

2. Background Art

Boron nitride crucibles have been used as evaporation source boats for use under high vacuum conditions. In particular, such show great promise in molecular beam epitaxy processing with such materials as gallium. However, the source boats presently available require high current input which necessitates the use of cumbersome electrical supply equipment for resistance heating. Moreover, contamination from the nitrogen present in the boron nitride under certain conditions is very undesirable and can be quite a problem depending upon the particular ingredients being treated in the crucible. For instance, molten gallium can be contaminated with the nitrogen from the boron nitride crucible.

Difficulties have been experienced in attempting to coat and/or bond boron nitride with certain metals. Along these lines, see for instance U.S. Pat. Nos. 3,926,571 and 3,344,505. In addition, attempts to coat boron onto a substrate has usually involved a gaseous mixture of a boron compound along with a gas, such as hydrogen, as exemplified by U.S. Pat. Nos. 3,677,799 and 3,949,122.

DISCLOSURE OF INVENTION

The present invention is concerned with a process for forming a refractory compound structure. The refractory compound is a combination of a refractory and/or metallic element and a nonmetallic element. The refractory and/or metallic element is solid at normal room temperatures and has a vapor pressure of at least one order of magnitude lower than the vapor pressure of the nonmetallic element of the refractory compound in the temperature range at which decomposition of the refractory compound occurs. This significant difference in vapor pressures results in what can be referred to as nonstoichiometric decomposition of the refractory compound. The refractory compound structure has an adherent dense elemental layer of the refractory and/or metallic element of the refractory compound over at least one surface of the structure.

The process includes evacuating a chamber which contains the refractory compound and heating the refractory compound in the chamber at a decomposition temperature for a time sufficient to form the elemental layer of the refractory and/or metallic element component of the refractory compound on the surfaces of the refractory compound.

The present invention is also concerned with the above-defined refractory compound structures and to structures obtained by the above discussed process.

BRIEF DESCRIPTION OF DRAWING

The FIGURE shows boron data including that obtained by treating a boron nitride article according to the present invention.

BEST AND VARIOUS MODES FOR CARRYING OUT INVENTION

The process of the present invention is applicable for treating refractory compounds which are combinations of a refractory and/or metallic element and a nonmetallic element. The refractory and/or metallic element must be solid at normal room temperatures and must have a vapor pressure of at least one order of magnitude lower than the vapor pressure of the nonmetallic element of the refractory compound in the temperature range at which decomposition of the refractory compound occurs. This difference in vapor pressure is essential to the practice of the present invention, since such makes it possible for the decomposition of the compounds to be nonstoichiometrical whereby the nonmetallic element can be removed from the system such as by being pumped away under low pressure. In turn, the refractory and/or metallic element of the refractory compound will remain as an elemental layer on the refractory compound.

Examples of suitable refractory compounds are Group III–V compounds and Group II–VI refractory compounds, provided that the refractory and/or metallic element and nonmetallic element of said compounds satisfy the above discussed requirements. Examples of specific compounds which can be treated according to the present invention are aluminum nitride and preferably boron nitride. Mixtures of compounds and/or compounds of mixtures of refractory and/or metallic elements and/or nonmetallic elements can be used, if desired.

The process of the present invention results in the formation of a uniform film of the refractory and/or metallic element of the refractory compound and forms such selectively in that such does not form in those areas of the refractory compound which are not heated to the decomposition temperature under the conditions and for the times required by the process of the present invention.

The selectivity of the coating of the present invention makes it possible to coat less than an entire surface and coat only preselected areas for a controlled geometry by appropriate masking over any of the refractory compound which is not to be subjected to the high temperatures of the decomposition of the refractory compound. Also, coating of preselected areas can be accomplished by masking areas of the refractory compound with a material which retards decomposition of refractory compound, such as $Al_2O_3$ or BN, and then subjecting the entire surface to the decomposition temperatures. In addition, predetermined controlled geometry for the coating can be obtained by using laser heating and writing of the controlled or predetermined geometry on the surface. This technique is suitable for providing circuits on ceramics, for instance for chip-bonding whereby extremely high resolution is not necessary. Such a process is quite advantageous, since it is planar. In addition, layered structures can be obtained by a subsequent pyrolytic deposition of subsequent layers.

The formation of a uniform elemental layer of the refractory and/or metallic element of the refractory compound is quite surprising in view of the previous experience with the decomposition of, for instance, other Group III-V compounds, such as gallium arsenide. The heating of gallium arsenide in vacuum is known to form droplets and not a uniform film. In fact, such decomposition has been a problem in semiconductive devices employing gallium arsenide.

The structures treated according to the present invention can be any desired type of structure including crucibles or boats which can be used in vacuum evaporation processes in molecular epitaxy processing, such as in the evaporation of gallium.

The process of the present invention is carried out by placing the refractory compound to be treated in a chamber and evacuating the chamber to provide an environment of less than about $10^{-3}$ torr.

These surfaces and/or portions of surfaces of the refractory compound on which it is desired to form the elemental layer are heated while under vacuum to decomposition temperature which for boron nitride is usually from about 1500° to about 1800° C. For boron nitride, the preferred temperature is about 1600° C. For aluminum nitride, the temperature is about 1300° to 1700° C. The heating is carried out for a time sufficient to form the elemental layer of the refractory and/or metallic element on the structure and is usually about 2 to about 20 hours, and preferably from about 5 to about 15 hours.

The temperature and time are inversely related. That is, when employing temperatures near the upper end of the range, the times employed can be nearer the lower end of the range given, and vice versa.

Preferably, the nonmetallic element of the refractory compound in gaseous form is removed or pumped away from the treating zone under low pressure as it is formed in the decomposition of the refractory compound. For instance, when employing boron nitride, atomic nitrogen is preferably pumped away from the treating zone. Typically, coatings of the refractory compound for use as crucibles of about 0.1 to about 25 microns are formed by the present invention.

The following nonlimiting example is presented to further illustrate the present invention.

EXAMPLE

A boron nitride crucible about 1½" long and about ⅜" in diameter with a wall thickness of about 500 microns is placed within a chamber which is evacuated to about $5 \times 10^{-6}$ torr. The boron nitride crucible is subjected to 1600° C. for about 10 hours. The product obtained shows a gray metallic coating of boron of about 10 microns thick over the entire crucible except for the base of the crucible upon which it was standing in the chamber. The coating is electrically conductive.

Curve 1 in the FIGURE represents the amount of boron measured in the coating on the crucible. A comparison of curve 1 with curve 2, which is the curve obtained from standard boron, and with curve 3, which is the results obtained from boron nitride, illustrate that the coating is substantially elemental boron.

Curve 1 is somewhat shifted to the left of curve 2 for standard boron in view of the presence of the boron nitride beneath the boron in the sample of the present invention.

In view of the relatively high resistance of the boron refractory layer, it is possible to provide high energy to the boron nitride article coated with the boron at relatively low current levels. On the other hand, source crucibles presently available require high current input which necessitates cumbersome electrical supply equipment for resistance heating.

What is claimed is:

1. A process of forming a refractory compound structure wherein said compound is a combination of a metallic element wherein said metallic element is solid at normal room temperature and has a vapor pressure of at least one order of magnitude lower than that of said nonmetallic element in the temperature range at which decomposition of the refractory compound occurs, and wherein the structure has an adherent dense elemental layer of said refractory compound over the surface of the structure which comprises:

evacuating a chamber containing a refractory compound structure to a pressure less than about $10^{-3}$ torr; and heating said refractory compound structure in said chamber at a decomposition temperature of about 1500° C. to about 1800° C. for a time sufficient to form an elemental layer of said metallic component of said refractory compound on said structure.

2. The process of claim 1 wherein said refractory compound is selected from the Group III-V and Group II-VI refractory compounds.

3. The process of claim 1 wherein said refractory compound is boron nitride.

4. The process of claim 1 wherein the refractory compound is heated to a decomposition temperature for about 2 to about 20 hours.

5. The process of claim 1 wherein the refractory compound is heated to a decomposition temperature for about 5 to about 15 hours.

6. The process of claim 1 wherein the thickness of said elemental layer is about 0.1 to about 25 microns.

7. The process of claim 1 wherein the refractory structure is heated to a temperature of about 1600° C. for about 5 to about 15 hours.

8. The process of claim 1 wherein the nonmetallic species is evacuated from the chamber when formed from the decomposition.

9. The process of claim 1 wherein said elemental layer is formed on preselected areas of said refractory compound less than the entire surface.

10. The process of claim 3 wherein the thickness of said elemental layer is about 0.1 to about 25 microns.

11. A process of forming a boron nitride structure wherein the structure has an adherent dense elemental layer or boron over the surface of the structure which comprises:

evacuating a chamber containing a boron nitride structure to a pressure less than about $10^{-3}$ torr; and heating said boron nitride structure in said chamber at a decomposition temperature for a time sufficient to form an elemental layer of boron on said structure.

12. The process of claim 11 wherein the thickness of said elemental layer is about 0.1 to about 25 microns.

13. The process of claim 11 wherein the refractory structure is heated to a temperature of about 1500° C. to 1800° C. for about 2 to about 20 hours.

14. The process of claim 11 wherein the refractory structure is heated to a temperature of about 1600° C. for about 5 to about 15 hours.

15. The process of claim 11 wherein the nonmetallic species is evacuated from the chamber when formed from the decomposition.

16. The process of claim 11 wherein the boron nitride is heated to a temperature of about 1500° to 1800° C.

17. The process of claim 11 wherein the boron nitride is heated to a temperature of about 1600° C.

18. The process of claim 11 wherein said elemental layer is formed on preselected areas of said refractory compound less than the entire surface.

19. The process of claim 18 which further comprises masking over areas of said refractory compound which are not to be subjected to the decomposition temperature.

20. The process of claim 18 which further comprises masking areas of the refractory compound with a material which retards decomposition of said refractory compound, and subjecting the entire surface to said decomposition temperature whereby said elemental layer forms only in the unmasked areas.

21. The process of claim 18 wherein said elemental layer is formed by laser heating.

* * * * *